(12) United States Patent
Wu

(10) Patent No.: US 10,383,255 B2
(45) Date of Patent: Aug. 13, 2019

(54) EDGE SEALING HEAT-DISSIPATING FILM

(71) Applicant: GETAC TECHNOLOGY CORPORATION, Hsinchu County (TW)

(72) Inventor: Chi-Jung Wu, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 39 days.

(21) Appl. No.: 15/912,522

(22) Filed: Mar. 5, 2018

(65) Prior Publication Data

US 2018/0295747 A1    Oct. 11, 2018

Related U.S. Application Data

(60) Provisional application No. 62/482,115, filed on Apr. 5, 2017.

(51) Int. Cl.
| | |
|---|---|
| *B32B 3/00* | (2006.01) |
| *H05K 7/20* | (2006.01) |
| *F25D 5/00* | (2006.01) |
| *H05K 7/14* | (2006.01) |
| *F28F 21/08* | (2006.01) |
| *H01L 23/373* | (2006.01) |
| *H01L 27/01* | (2006.01) |
| *H01L 23/367* | (2006.01) |

(52) U.S. Cl.
CPC ........... *H05K 7/20481* (2013.01); *F25D 5/00* (2013.01); *F28F 21/084* (2013.01); *H01L 23/3735* (2013.01); *H01L 23/3736* (2013.01); *H01L 23/3737* (2013.01); *H05K 7/1404* (2013.01); *H05K 7/20472* (2013.01); *H01L 23/367* (2013.01); *H01L 27/016* (2013.01)

(58) Field of Classification Search
CPC . H05K 7/20481; H05K 7/1404; F28F 21/084; H01L 23/3735; H01L 23/3736; H01L 23/3737

See application file for complete search history.

(56) References Cited

U.S. PATENT DOCUMENTS

| | | | |
|---|---|---|---|
| 5,550,326 A * | 8/1996 | Kesel | H01L 23/3672 165/185 |
| 2005/0221537 A1* | 10/2005 | Tomabechi | H01L 21/4857 438/122 |
| 2016/0120017 A1* | 4/2016 | Momoi | H01L 23/3735 361/720 |

* cited by examiner

*Primary Examiner* — Elizabeth E Mulvaney

(57) ABSTRACT

An edge sealing heat-dissipating film includes a heat radiation emitting film, a metal film and a heat radiation receiving film. The heat radiation emitting film has a first opening. The metal film is disposed to the heat radiation emitting film and the metal film has a second opening. The second opening is positioned corresponding to the first opening. The heat radiation receiving film is disposed to the metal film and the heat radiation receiving film has a third opening. Wherein, the shape of the heat radiation emitting film is the same as the shape of the heat radiation receiving film. And the area of the metal film is slightly smaller than the area of the heat radiation receiving film and the heat radiation emitting film. Therefore, the outer periphery of the heat radiation emitting film and the outer periphery of the heat radiation receiving film could be closely bonded together.

8 Claims, 3 Drawing Sheets

EDGE SEALING HEAT-DISSIPATING FILM

CROSS-REFERENCE TO RELATED APPLICATIONS

This application claims the benefit of U.S. Application No. 62/482,115, filed on Apr. 5, 2017, the entire disclosure of which is hereby incorporated by reference.

BACKGROUND OF THE INVENTION

Field of the Invention

The present invention relates to an edge sealing heat dissipating film, and more particularly, to an edge sealing heat dissipating film that completely covers a metal film so as to provide a better heat dissipation effect and to prevent short circuit.

Description of the Prior Art

In a common electronic product, in order to maintain better heat dissipation, main heat emitting electronic components (e.g., CPU, DDR and WiFi module) on a motherboard are usually provided with reinforced heat dissipation designs. Thus, these electronic components can be kept at an appropriate operating temperature to maintain normal operations of the system.

However, heat dissipation designs are usually provided with respect to the above components that emit substantial amounts of heat, and exclusive heat dissipation designs for other components such as power source assemblies are less common. Further, for factors such as preventing short circuit, Mylar (polyester resin) in a plastic material is additionally adhered on a motherboard to prevent short circuit, which contrarily hinders heat dissipation of other secondary components on the motherboard. Further, if aluminium foil needs to be additionally adhered for heat dissipation on the motherboard, an insulation layer such as Mylar is also needed on the aluminium foil to prevent short circuit.

SUMMARY OF THE INVENTION

In view of the above, an edge sealing heat dissipating film is provided according to an embodiment of the present invention. The edge sealing heat dissipating film includes a heat radiation emitting film, a metal film and a heat radiation receiving film. The heat radiation emitting film has a first opening. The metal film is disposed on the heat radiation emitting film, and has a second opening. The second opening is positioned corresponding to the first opening. The heat radiation receiving film is disposed on the metal film, and has a third opening. The third opening is positioned corresponding to the first opening. The shape of the heat radiation emitting film is identical to that of the heat radiation receiving film, and the area of the metal film is slightly smaller than those of the heat radiation emitting film and the heat radiation receiving film. Thus, a distance exists between an outer periphery of the metal film and an outer periphery of the heat radiation emitting film, and the outer peripheries of the heat radiation emitting film and the heat radiation receiving film are closely bonded.

To provide a better heat dissipation function and to use a metal film made of a metal material to cover a motherboard or other electronic components, the heat radiation receiving film and the heat radiation emitting film, which are small in thickness and provide insulation as well as heat dissipation functions, can be used to enclose the entire metal film. Thus, in addition to improving the overall thickness, the heat radiation receiving film and the heat radiation emitting film provide a heat dissipation function. Further, the heat radiation receiving film and the heat radiation emitting film completely enclose the metal film, and an outer circumference of the outer peripheries of the heat radiation receiving film and the heat radiation emitting film has a completely sealed edge. Hence, when a heat dissipating film is assembled by means of fastening, the internal metal film is prevented from being exposed, and the issue of short circuit caused by a metal fastening member coming into contact with the internal metal film is eliminated.

In some embodiments, the second opening is slightly greater than the first opening, in a way that a distance exists between the periphery of the first opening and the periphery of the second opening, and the periphery of the first opening of the heat radiation emitting film and the periphery of the third opening of the heat radiation receiving film are closely bonded. If any opening is required on the edge sealing heat dissipating film, the edges of the peripheries of the openings can be sealed to eliminate the issue of short circuit.

In some embodiments, the heat radiation emitting film may be a polyethylene terephthalate (PET) film, and the heat radiation receiving film may also be a PET film. With the small thickness of the PET film, the thickness of the insulation film can be decreased to reduce the overall thickness.

In some embodiments, the heat radiation emitting film and the heat radiation receiving film may be black opaque films. By using properties that black easily absorbs heat and dissipates heat, the heat radiation receiving film at one side of heat emitting components can effectively receive heat energy from these heat emitting components. The heat radiation emitting film at an outer surface can effectively dissipate heat into the air, improving the heat radiation emission efficiency of the metal film.

In some embodiments, the material of the metal film can be selected from a group consisting of aluminum, silver and copper. By using the property of metal having good heat conductivity, heat energy on the heat emitting components can be conducted and emitted into the air.

In some embodiments, the thickness of the metal film may be 0.1 mm, and the thicknesses of the heat radiation emitting film and the heat radiation receiving film may be between 0.01 mm and 0.03 mm. Thus, the metal film has a greater thickness for enhancing the heat conduction efficiency, whereas the insulation layer has a smaller thickness for reducing the overall thickness.

DETAILED DESCRIPTION OF THE EMBODIMENTS

Figure 1:
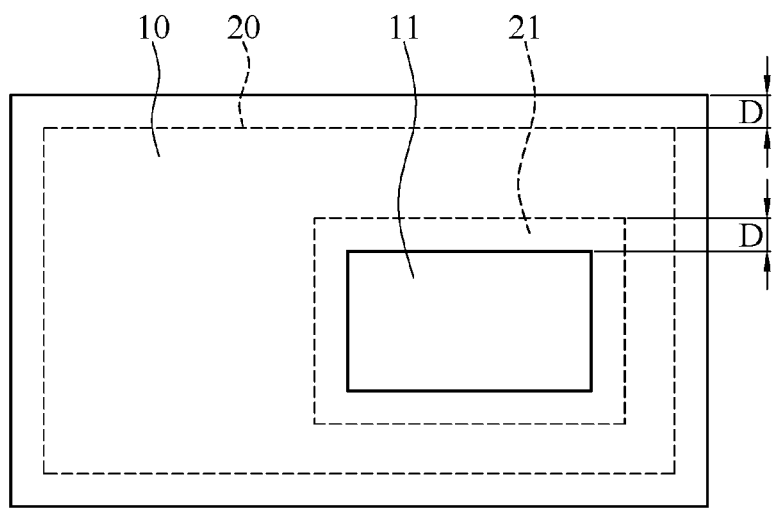
FIG. 1 is a schematic diagram of an edge sealing heat dissipating film according to an embodiment of the present invention.
Figure 2:
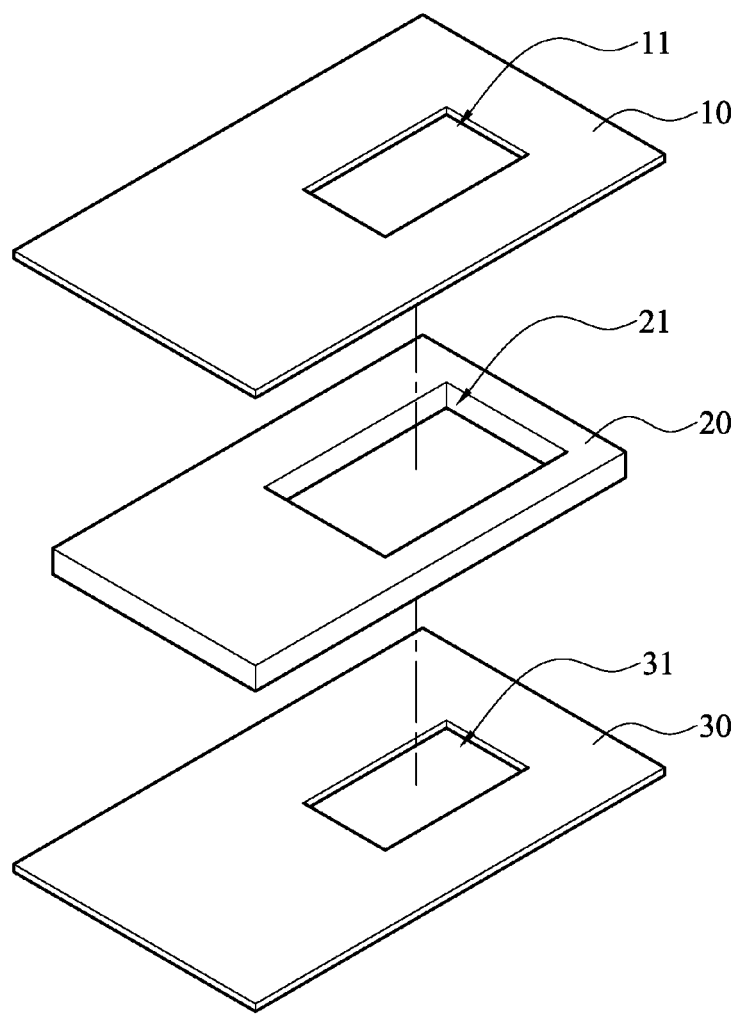
FIG. 2 is an exploded diagram of an edge sealing heat dissipating film according to an embodiment of the present invention.
Figure 3:
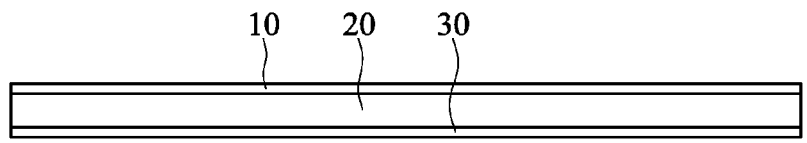
FIG. 3 is a partial section view of an edge sealing heat dissipating film according to an embodiment of the present invention.

Refer to FIG. 1 to FIG. 3. FIG. 1 shows a schematic diagram of an edge sealing heat dissipating film according to an embodiment of the present invention. FIG. 2 shows an exploded diagram of an edge sealing heat dissipating film according to an embodiment of the present invention. FIG. 3 shows a partial section view of an edge sealing heat dissipating film according to an embodiment of the present invention. The edge sealing heat dissipating film according to an embodiment of the present invention includes a heat radiation emitting film 10, a metal film 20 and a heat radiation receiving film 30. To better present ratio relations of structures of different layers, associated thicknesses are enlarged and depicted in FIG. 2 and FIG. 3, and these thicknesses may be adjusted according to requirements. In this embodiment, the thicknesses of a heat radiation emitting film 10 and a heat radiation receiving film 30 are approximately 0.03 mm, and the thickness of a metal film 20 is approximately 0.1 mm. The heat radiation emitting film 10 has a first opening 11. The metal film 20 is disposed on the heat radiation emitting film 10, and has a second opening 21. The second opening 21 is positioned corresponding to the first opening 11. The heat radiation receiving film 30 is disposed on the metal film 20, and has a third opening 31. The third opening 31 is positioned corresponding to the first opening 11.

As seen from FIG. 3, after stacking, the assembly sequentially includes, from top to bottom, the heat radiation emitting film 10, the metal film 20 and the heat radiation receiving film 30. The heat radiation receiving film 30 is located at one side where the electronic components emitting heat, and the heat radiation emitting film 10 is at one side for emitting heat.

As seen from FIG. 2, the shape of the heat radiation emitting film 10 is identical to the shape of the heat radiation receiving film 30, and the area of the metal film 20 is slightly smaller than the areas of the heat radiation emitting film 10 and the heat radiation receiving film 30. Thus, as shown in FIG. 1, after stacking, a distance D exists between an outer periphery (represented by an outermost dotted line) of the metal film 20 and an outer periphery (represented by an outermost solid line) of the heat radiation emitting film 10. The outer peripheries of the heat radiation emitting film 10 and the heat radiation receiving film 30 are closely bonded, and the range within the distance D is tightly sealed.

Accordingly, when the edge sealing heat dissipating film is arranged on a motherboard or on other heat emitting electronic components, a better heat dissipation function is provided. Further, by using the heat radiation receiving film 30 and the heat radiation emitting film 10 having a smaller thickness and an insulation function as well as heat dissipation functions to package the metal film 20, in addition to improving the overall thickness of the edge sealing heat dissipating film, the heat energy in the metal film 20 can also be more easily transmitted to the exterior because the heat radiation receiving film 30 and the heat radiation emitting film 10 have smaller thicknesses.

Further, the heat radiation receiving film 30 and the heat radiation emitting film 10 completely enclose the metal film 20, and the outer circumference of the outer peripheries of the heat radiation receiving film 30 and the heat radiation emitting film 10 has completely sealed edges. Thus, when the edge sealing heat dissipating film is assembled by means of fastening, the internal metal film 20 is prevented from being exposed, and the issue of short circuit caused by a metal fastening member coming into contact with the internal metal film 20 is eliminated. Moreover, the distance D is preserved between the outer circumference of the heat radiation emitting film 10 and the metal film 20 provides a space for the fastening of a fastening element, which is thus prevented from coming into contact with the internal metal film 20.

Further, the value of the distance D can be adjusted depending on actual conditions. The distance D can be minimized when a position for a fastening hole is not needed to be preserved, so as to maximize the area of the metal film 20. On the other hand, for a position where a fastening hole is needed, the distance D can be adjusted to an appropriate distance according to an appropriate aperture of the hole, so as to prevent the fastening element from coming into contact with the metal film 20 and resulting in short circuit after the fastening element is fastened.

Again referring to FIG. 1, because openings need to be provided at some positions to expose the electronic components, in order to keep the metal film 20 unexposed, the second opening 21 is slightly greater than the first opening 11, such that the distance D exists between the periphery of the first opening 11 and the periphery of the second opening 21. In addition, the periphery of the first opening 11 of the heat radiation emitting film 10 is closely bonded with the periphery of the third opening 31 of the heat radiation receiving film 30. Thus, the metal film 20 can be tightly sealed between the heat radiation receiving film 30 and the heat radiation emitting film 10. The distance D may be an equal distance as the foregoing distance D, or may be a distance D having a different value depending on actual requirements, given that a distance is preserved.

In this embodiment, the heat radiation emitting film 10 is a polyethylene terephthalate (PET) film, and the heat radiation receiving film 30 is also a PET film. With the smaller thickness of a PET film, the thicknesses of the heat radiation emitting film 10 and the heat radiation receiving film 30 used as insulation layers can be decreased to reduce the overall thickness.

Further, in this embodiment, the heat radiation emitting film 10 and the heat radiation receiving film 30 are selected from black opaque films. By using properties that black easily absorbs heat and dissipates heat, the heat radiation receiving film 30 located at the side of heat emitting components can effectively receive heat energy from these heat emitting components, and the heat radiation emitting film 10 at an outer surface can effectively dissipate heat into the air, improving the heat radiation emitting efficiency of the metal film 20. Proven by experimental tests, if the metal film 20 is made of an aluminum film, and the heat radiation emitting film 10 and the heat radiation receiving film 30 made of black opaque films are used, the heat radiation emission efficiency of the metal film 20 can be improved from an original value of 0.1 to be greater than 0.9.

The metal film 20 may be made of a material selected from a group consisting of aluminum, silver and copper. In this embodiment, as aluminum provides overall advantages in aspects of ductility, heat conductivity, price and weight, aluminum is taken as an example. However, depending on actual application conditions, other heat dissipating materials may also be selected. For example, if a smaller area of heat dissipating film is needed, a copper or silver material may be selected for manufacturing the metal film 20.

In this embodiment, to provide a better heat dissipation effect and to provide the edge sealing heat dissipating film with a smaller overall thickness, the thickness of the metal film 20 is 0.1 mm, and the thicknesses of the heat radiation emitting film 10 and the heat radiation receiving film 30 are between 0.01 mm and 0.03 mm. With such thickness configuration, an aluminum film is used, and the edge sealing heat dissipating film, which is formed by sealing the edge of the aluminum film by the heat radiation emitting film 10 and the heat radiation receiving film 30 made of black opaque films, is used to cover heat emitting components on a motherboard. Comparison is carried out between the above and heat emitting components covered by insulation layers formed by an aluminum film and Mylar on a motherboard. It is discovered through experimental results that, the edge sealing heat dissipating film of the embodiment reduces the temperature of the components on the motherboard by 3 to 5 degrees compared to the heat dissipating film made of an insulation film formed by an aluminum film and Mylar.

Figure 4:
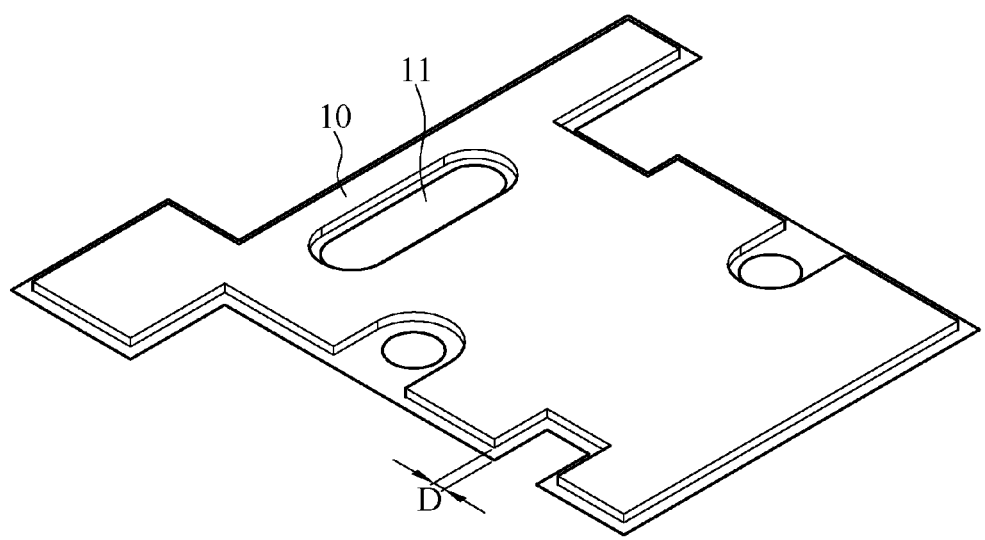
FIG. 4 is a schematic diagram of an edge sealing heat dissipating film in another application according to an embodiment of the present invention.

FIG. 4 shows a schematic diagram of an edge sealing heat dissipating film in another application according to an embodiment of the present invention. When the edge sealing heat dissipating film of the embodiment is put to an actual application, multiple fastening holes may be formed or provided by means of excavating or cutting. To minimize the distance D of the sealed edges, shifting inwards is needed only at positions where holes are provided or where components are to be avoided while the distance D of the remaining edges are minimized, thus maximizing the area of the metal film 20 disposed therein to enhance the overall heat dissipation effect.

While the invention has been described in terms of what is presently considered to be the most practical and preferred embodiments, it is to be understood that the invention is only illustrative and needs not to be limited to the above embodiments. It should be noted that, equivalent variations and replacements made to the embodiments are to be encompassed within the scope of the present invention. Therefore, the scope of the present invention is to be accorded with the appended claims.

What is claimed is:

1. An edge sealing heat dissipating film, being characterized in comprising:
   a heat radiation emitting film, having a first opening;
   a metal film, disposed on the heat radiation emitting film, having a second opening, the second opening positioned corresponding to the first opening; and
   a heat radiation receiving film, disposed on the metal film, having a third opening, the third opening positioned corresponding to the first opening;
   wherein, a shape of the heat radiation emitting film is identical to a shape of the heat radiation receiving film, and an area of the metal film is slightly smaller than areas of the heat radiation emitting film and the heat radiation receiving film, such that a distance exists between an outer periphery of the metal film and an outer periphery of the heat radiation emitting film, and outer peripheries of the heat radiation emitting film and the heat radiation receiving film are closely bonded.

2. The edge sealing heat dissipating film according to claim 1, being characterized that, the second opening is slightly greater than the first opening such that the distance exists between a periphery of the first opening and a periphery of the second opening, and a periphery of the first opening of the heat radiation emitting film and a periphery of the third opening of the heat radiation receiving film are closely bonded.

3. The edge sealing heat dissipating film according to claim 1, being characterized that, the heat radiation emitting film is a polyethylene terephthalate (PET) film.

4. The edge sealing heat dissipating film according to claim 1, being characterized that, the heat radiation receiving film is a polyethylene terephthalate (PET) film.

5. The edge sealing heat dissipating film according to claim 1, being characterized that, the heat radiation emitting film and the heat radiation receiving film are black opaque films.

6. The edge sealing heat dissipating film according to claim 1, being characterized that, the metal film is made of a material selected from a group consisting of aluminum, silver and copper.

7. The edge sealing heat dissipating film according to claim 1, being characterized that, a thickness of the metal film is 0.1 mm.

8. The edge sealing heat dissipating film according to claim 7, being characterized that, thicknesses of the heat radiation emitting film and the heat radiation receiving film are between 0.01 mm and 0.03 mm.

\* \* \* \* \*